(12) United States Patent
Goetz et al.

(10) Patent No.: US 8,231,692 B2
(45) Date of Patent: Jul. 31, 2012

(54) METHOD FOR MANUFACTURING AN ELECTRONIC DEVICE

(75) Inventors: Martin P. Goetz, Cary, NC (US); Gary E. O'Neil, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 787 days.

(21) Appl. No.: 12/266,329

(22) Filed: Nov. 6, 2008

(65) Prior Publication Data
US 2010/0110651 A1 May 6, 2010

(51) Int. Cl.
*H01L 21/00* (2006.01)
(52) U.S. Cl. ............. 29/25.01; 29/832; 29/830; 29/831; 29/846; 29/852
(58) Field of Classification Search ............ 29/852, 29/830, 831, 832, 846, 847, 25.01; 361/782, 361/818, 704, 715, 716, 703; 438/107, 782, 438/127, 128, 122, 124
See application file for complete search history.

(56) References Cited

U.S. PATENT DOCUMENTS

| | | | |
|---|---|---|---|
| 6,359,341 B1 * | 3/2002 | Huang et al. | 257/778 |
| 6,625,025 B1 * | 9/2003 | Duxbury et al. | 361/704 |
| 6,966,235 B1 * | 11/2005 | Paton | 73/865.9 |
| 7,228,894 B2 | 6/2007 | Moore et al. | |
| 7,233,022 B2 | 6/2007 | Park et al. | |
| 2001/0041459 A1 * | 11/2001 | Smith et al. | 438/782 |
| 2005/0168941 A1 | 8/2005 | Sokol et al. | |
| 2005/0241817 A1 | 11/2005 | Moore et al. | |
| 2007/0276051 A1 | 11/2007 | Halimaton | |

* cited by examiner

*Primary Examiner* — David Bryant
*Assistant Examiner* — Tai Nguyen
(74) *Attorney, Agent, or Firm* — Yudell Isidore Ng Russell PLLC (57) ABSTRACT

During manufacture of an electronic device, an aerogel coating is applied to a first side of an IC substrate of a first IC. A bonding procedure is initiated, during which IC interconnects are either placed on the coated side of the substrate or on the opposite side of the substrate. The first IC is connected on a carrier to a second IC with the coated side of the first IC facing the second IC to reduce heat transmission to the second IC during operation of the first IC. The aerogel coating reduces thermal stress to the circuit board and surrounding components, reduces the risk of overheating of critical circuit components, provides chemical and mechanical insulation from contamination during subsequent wafer handling operations, and provides a thermal isolator between IC regions of dissimilar power dissipation, which isolator facilitates efficient thermal extraction from localized hotspots.

6 Claims, 9 Drawing Sheets

Figure 3A
The Prior Art

Figure 3B

Figure 4A
The Prior Art

METHOD FOR MANUFACTURING AN ELECTRONIC DEVICE

BACKGROUND

1. Technical Field

The present invention generally relates to integrated circuits and in particular to thermal isolation in integrated circuits.

2. Description of the Related Art

When two or more electronic devices with integrated circuits are stacked in a vertical plane, heat that is generated by one or more of the devices is able to couple to the other devices. Coating the surface of the electronic device(s) with a high thermal insulating material may provide improved isolation between heat sources and heat sinks with differing loads. Improved heat isolation is achieved by mitigating the propagation of heat to critical and/or temperature sensitive components or circuits.

Conventional materials in use for thermal isolation today are inadequate for applications in high thermal density environments. The materials deteriorate with time and exposure to steady state high temperatures and environmental conditions that exist in many high power and high performance applications. Also, based on thermal expansion characteristics, density, and thickness, conventional materials experience mechanical failures such as cracks and de-lamination from surfaces to which these materials were initially bonded. These mechanical failures reduce and sometimes nullify the effectiveness of the conventional materials as a thermal isolator or insulator.

When bonding two independent circuits together to create electrical connections between them or to create vertical integration, thermal isolation is very important. Materials used to bond two IC substrates together are applied to the area between the circuit substrates. The filler materials (either die attach or underfill materials) are not designed specifically for high thermal density isolation.

The drawbacks of bonding two substrates with high heat generating circuits include compound heat generation and localized heating of one or more of the adjoining surfaces. Efficient coupling of heat may lead to thermal runaway of one or more of the independent circuits on the substrate due to the additive heat sourced by one or more adjacent or proximate devices. Thermal runaway may be also caused by structural, mechanical and electrical failures due to differences in thermal coefficients of expansion and large thermal gradients across the device, as a result of the different characteristics of bonding and substrate materials.

SUMMARY OF ILLUSTRATIVE EMBODIMENTS

Disclosed are a method and system for providing thermal isolation between integrated circuit (IC) components of an electronic device. During manufacture of the device, an aerogel coating is applied to a first side of an IC substrate of a first IC. A bonding procedure is initiated, during which IC interconnects are either placed on the coated side of the substrate or on the opposite side of the substrate. The first IC is connected on a carrier to a second IC with the coated side of the first IC facing the second IC to reduce heat transmission to the second IC during operation of the first IC. The aerogel coating reduces thermal stress to the circuit board and surrounding components, reduces the risk of overheating of critical circuit components, provides chemical and mechanical insulation from contamination during subsequent wafer handling operations, and provides a thermal isolator between IC regions of dissimilar power dissipation, which isolator facilitates efficient thermal extraction from localized hotspots. The aerogel coating thus enables proper circuit behavior and enhances system performance.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The illustrative embodiments provide a method and system for providing thermal isolation within the integrated circuits (ICs) of an electronic device. Thermal isolation is provided by an aerogel coating applied to one side of an IC substrate. In order to connect ICs, a bonding procedure is initiated, during which, IC interconnects are either placed on the coated side of the substrate or on the opposite side of the coating. After completion of the bonding procedure, power is supplied to the ICs. The aerogel coating reduces thermal stress to the circuit board and surrounding components by providing: (1) a reduced risk of overheating of critical circuit components; (2) chemical and mechanical insulation from contamination during subsequent wafer handling operations; and (3) a thermal isolator between IC regions of dissimilar power dissipation, which isolator facilitates efficient thermal extraction from localized hotspots. Ultimately, the aerogel coating provides proper circuit behavior and system performance.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIGS. 1 and 2xx for FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation.

Figure 1A:
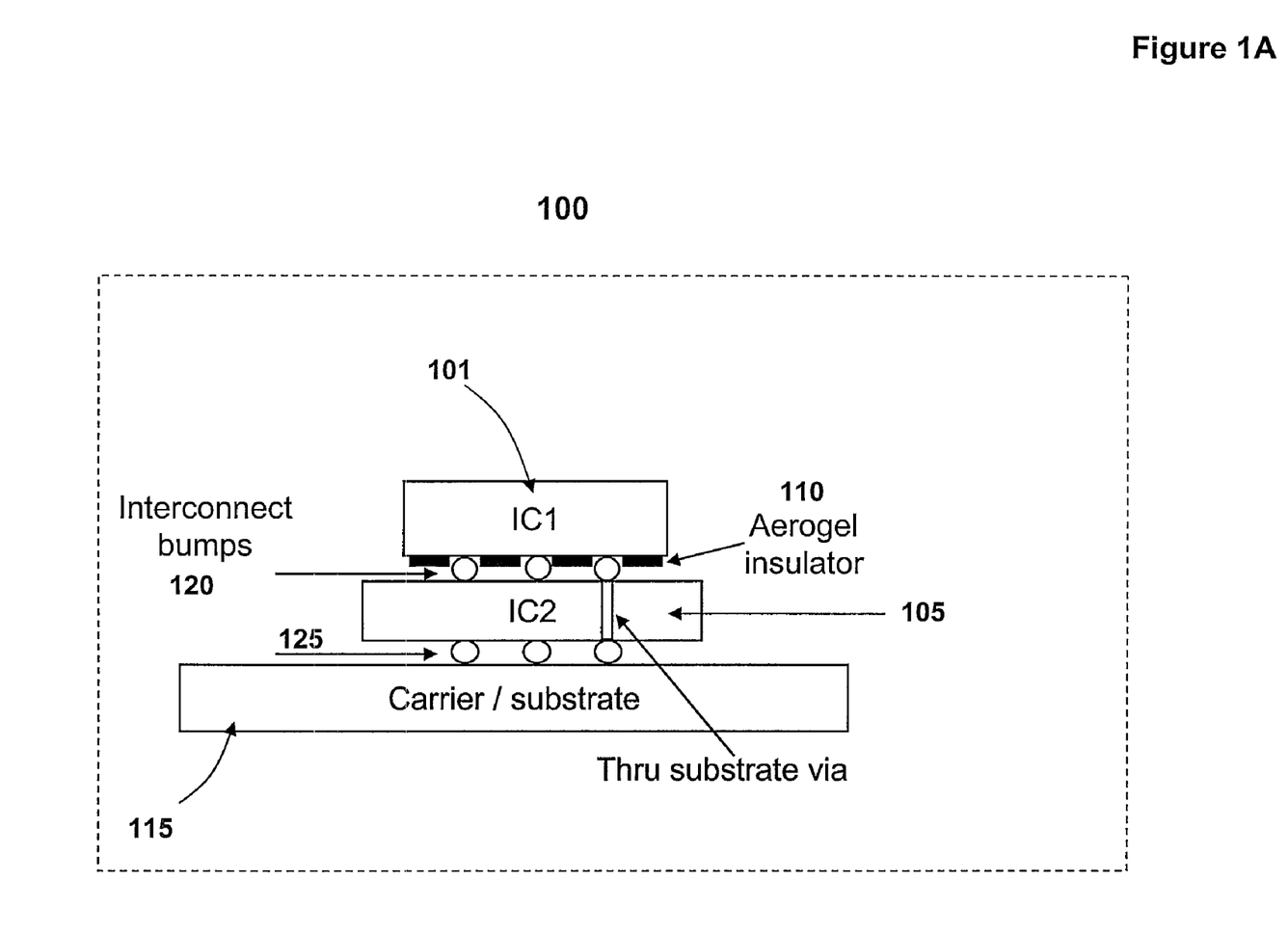
FIG. 1A illustrates a pair of flip chip integrated circuits (ICs) stacked within a vertical plane, according to one embodiment.

With reference now to FIG. 1A, there is depicted a pair of flip chip integrated circuits (ICs) stacked within a vertical plane, according to one embodiment. While the illustration of FIG. 1A and other/further illustrations are described from the perspective of ICs stacked in a vertical plane, other orientations of IC stacks are possible. For example, ICs may also be stacked in a horizontal plane. IC Stack 100 comprises IC1 101 and IC2 105. Applied to the surface of the substrate of IC1 101 is a thin coating of aerogel material, aerogel coating 110. Aerogel coating 110 is located on the same side of the substrate as first (bumps of) interconnects 120 for IC1 101. First Interconnects 120 ultimately connects IC1 101 and IC2 105. IC2 105 further connects to a major substrate or carrier 115, via second (bumps of) interconnects 125.

A flip chip IC utilizes a raised contact pad for coupling the IC to a carrier substrate containing (printed leads of) a printed circuit board (PCB) to which several chips may be coupled. In IC Stack 100, aerogel coating 110 is applied to the surface of a first component (e.g., IC1 101) during wafer processing. After the application of aerogel coating 110, the bonding process/procedure is initiated. During the bonding procedure, the first component (e.g., IC1 101) is connected to a second component (e.g., IC2 105). Aerogel coating 110 applied on the surface (of IC1 101) and positioned between the surface of IC1 101 and IC2 105 provides a thermal isolation barrier reducing heat dissipation between IC1 101 and IC2 105. In order to connect IC1 101 and IC2 105 (and further connecting IC2 105 to carrier 115), a final layer of interconnects (illustrated by first (bumps of) interconnects 120 and second (bumps of) interconnects 125) are coupled to IC1 101 and IC2 105. Aerogel coating 110 is located on the same side of the substrate (of IC1 101) as first (bumps of) interconnects 120.

Figure 1B:
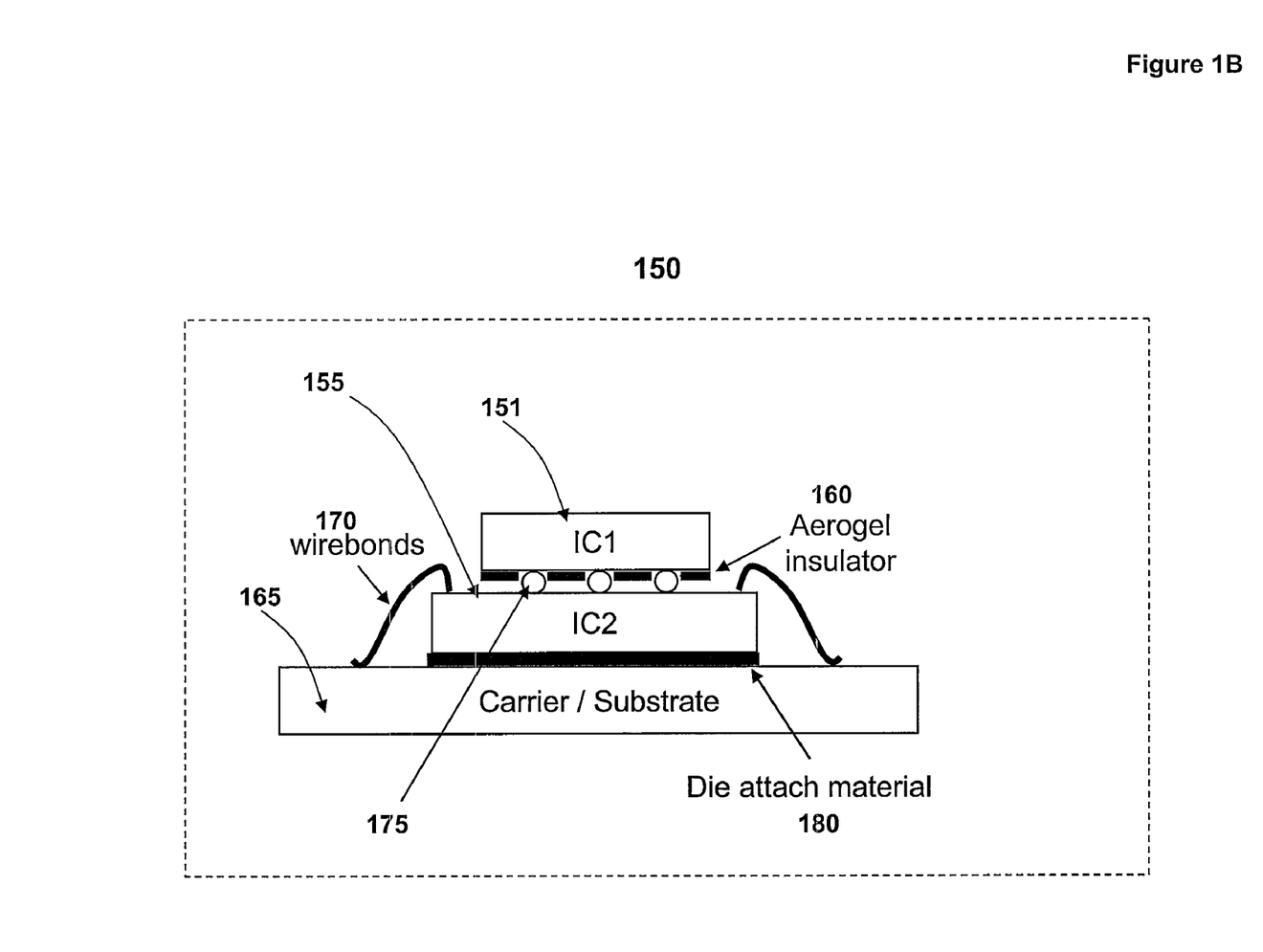
FIG. 1B illustrates a flip chip integrated circuit (IC) connected to a wire bond IC within a vertical plane, according to one embodiment.

FIG. 1B illustrates a flip chip integrated circuit (IC) connected to a wire bond IC within a vertical plane, according to one embodiment. IC Stack 150 comprises IC1 151 and IC2 155. Deposited on the surface of the substrate of IC1 151 is a thin coating of aerogel material, aerogel coating 160. During wafer processing, aerogel coating 160 is deposited on the same side of the substrate as the final layer of interconnects and circuits created for the integrated circuit. First Interconnects 175 ultimately connects IC1 151 and IC2 155. IC2 155 is electrically connected to a major substrate or carrier 165, via one or more connection mechanisms from among wirebonds 170 and raised metallic contact pads (e.g., interconnects 175). Interconnects 175 enable one or more of (a) signal exchange to and from the electronic device (comprising IC1 101 and IC2 105) or (b) power transfer to and from the electronic device during device operation. Die attach material 180 secures and fastens IC2 155 to carrier 165.

Figure 2A:
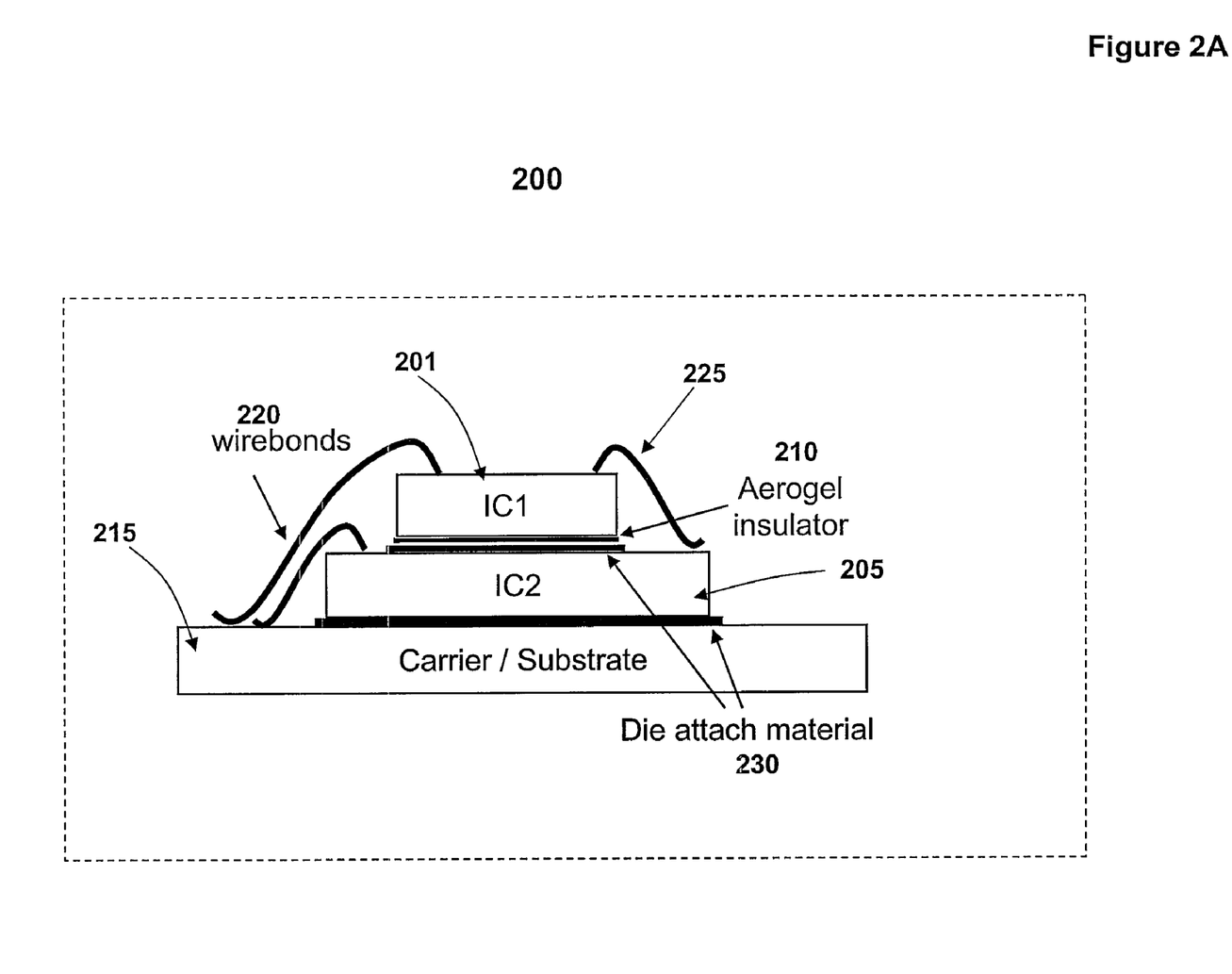
FIG. 2A illustrates a pair of wire bond integrated circuits (ICs) stacked within a vertical plane, according to one embodiment.

FIG. 2A illustrates a pair of wire bond integrated circuits (ICs) stacked within a vertical plane, according to one embodiment. IC Stack 200 comprises IC1 201 and IC2 205. Aerogel coating 210 is applied to the lower surface of the substrate of IC1 201. First wirebond 225 electrically connects the substrate of IC1 201 to the substrate of IC2 205. IC2 205 is electrically connected to major substrate or carrier 215, via wirebonds 220. Securing and fastening IC1 201 to IC2 205 is die attach material 230. Similarly, securing and fastening IC2 205 to carrier 215 is die attach material 230. In Stack 200, aerogel coating 210 is located on the side of the substrate that is opposite to the side which provides the electrical connection (via wirebonds 220) to carrier 215.

Figure 2B:
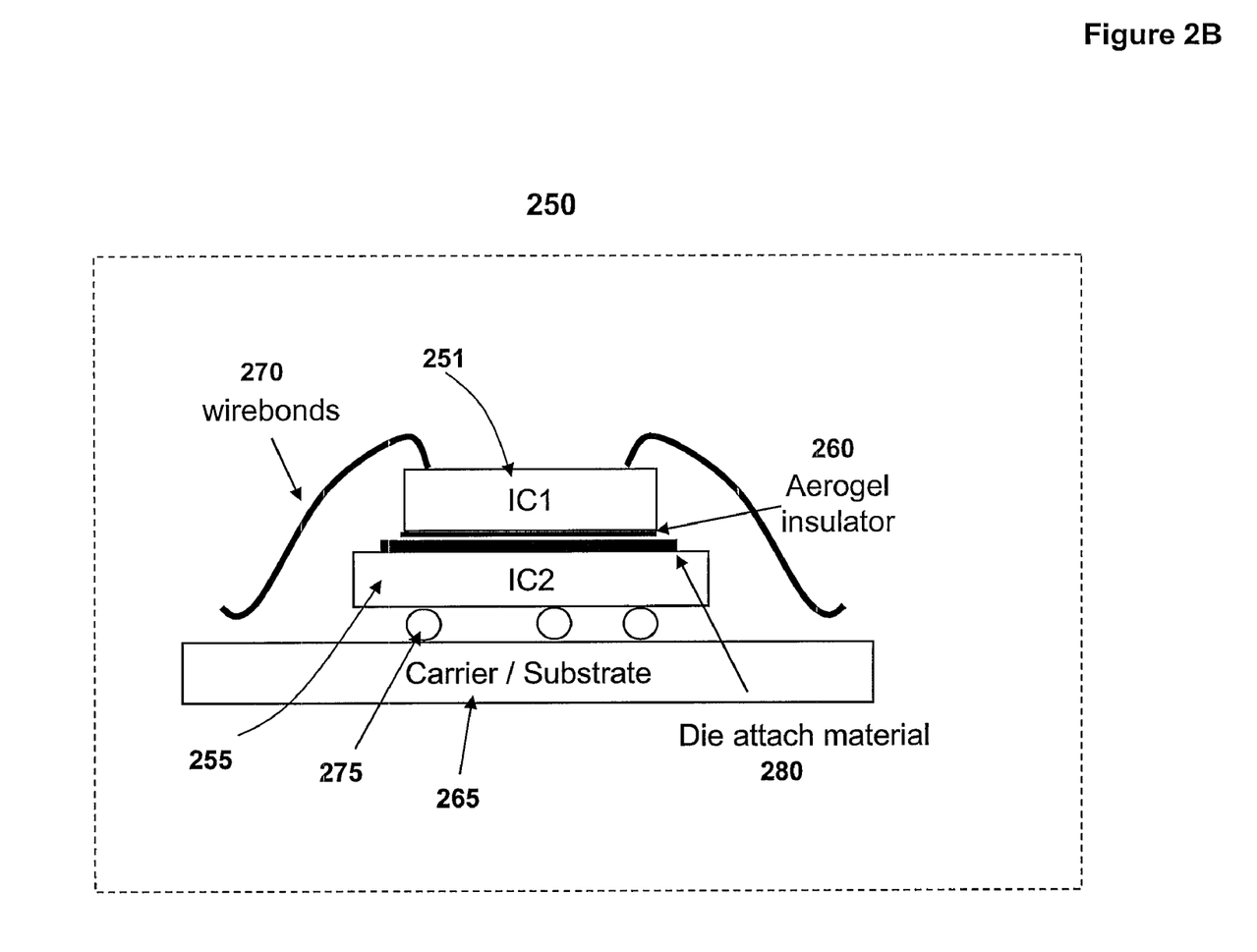
FIG. 2B illustrates a wire bond integrated circuit (IC) connected to a flip chip IC within a vertical plane, according to one embodiment.

FIG. 2B illustrates a wire bond integrated circuit (IC) connected to a flip chip IC within a vertical plane, according to one embodiment. IC Stack 250 comprises IC1 251 and IC2 255. Applied to the surface of the substrate of IC1 251 is aerogel coating 260. Wirebond(s) 270 electrically connects IC1 251 to carrier 265. FIG. 2B provides a similar configuration to FIG. 2A except that, unlike the configuration of FIG. 2A, IC2 255 is electrically connected to a major substrate, carrier 265, via interconnects 275. Securing and fastening IC1 251 to IC2 255 is die attach material 280.

In Stack 250, aerogel coating 260 is located on the side of the substrate that is opposite to the side which provides the electrical connection (via wirebonds 270) to carrier 265. Once power is supplied to either or both integrated circuits, IC1 251 and IC2 255, the surface of the IC with the aerogel coating provides isolation from the heat created through power loss (dissipation), restricting thermal coupling between the two integrated circuits devices. An explanation of the thermal isolation benefits of the aerogel coating is enhanced with the descriptions of FIGS. 3A, 3B, 4A and 4B.

Those of ordinary skill in the art will appreciate that the hardware and basic configuration depicted in FIG. 1 and FIG. 2 may vary. For example, other devices/components may be used in addition to or in place of the hardware depicted. The depicted examples are not meant to imply architectural limitations with respect to the present invention.

Figure 3A:
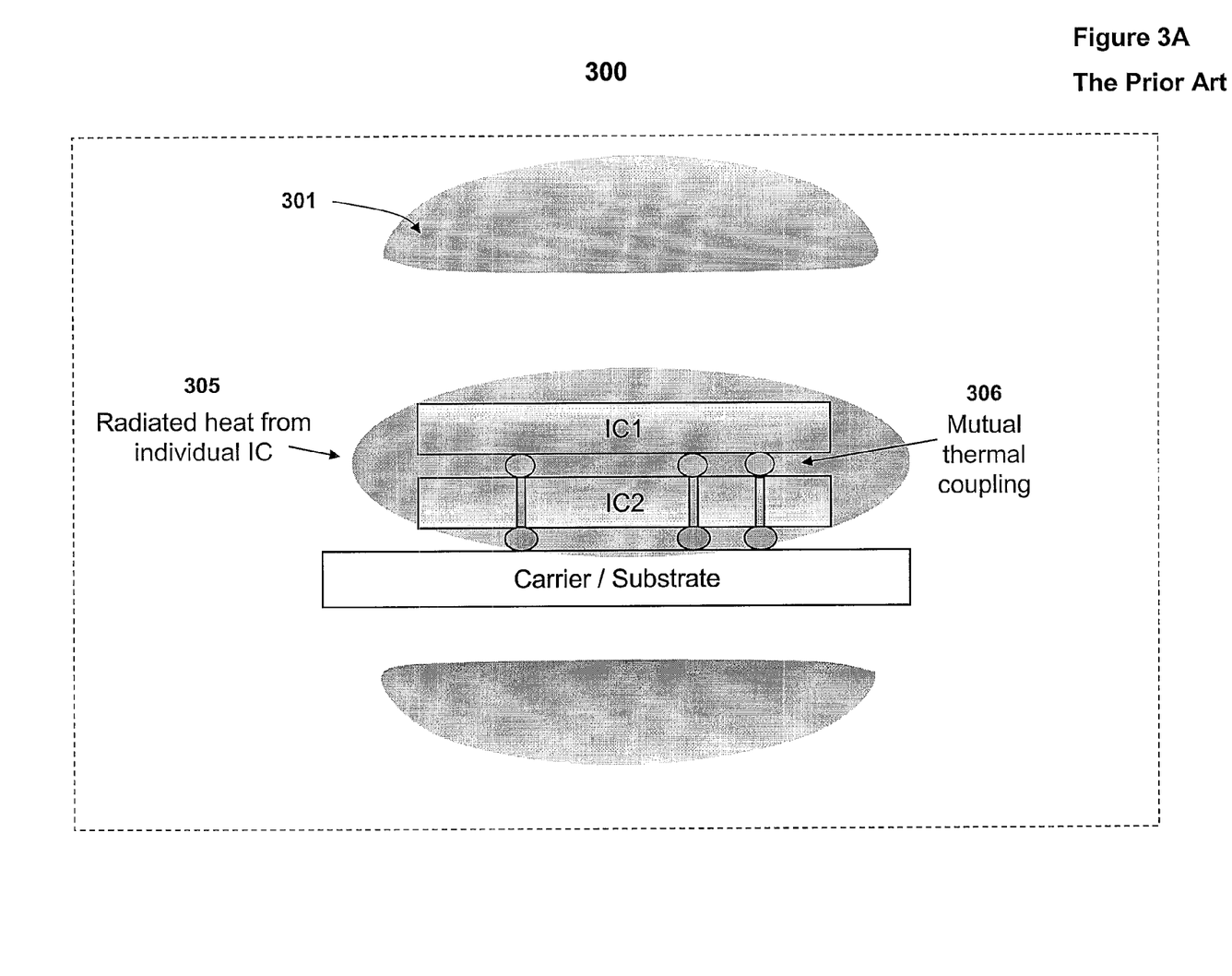
FIG. 3A illustrates thermal coupling between a pair of heat generating integrated circuits (ICs) stacked in a vertical plane, according to the prior art.

FIG. 3A illustrates thermal coupling between a pair of heat generating integrated circuits (ICs) stacked and connected in a vertical plane, according to the prior art. Stack 300 comprises radiated heat-1 301 and radiated heat 2-305. Radiated heat-1 301 and radiated heat 2-305 represent the heat dissipated by each individual IC within the pair of ICs of the vertical stack. No IC within the stack has an aerogel coating. In Stack 300, the coupling of heat-1 and heat-2 (e.g., coupled heat 306) causes the overheating of critical components and circuits within the integrated circuit(s). Furthermore, the overheated ICs may cause the electronic device (which houses the ICs) to exhibit degraded circuit behavior and system performance.

Figure 3B:
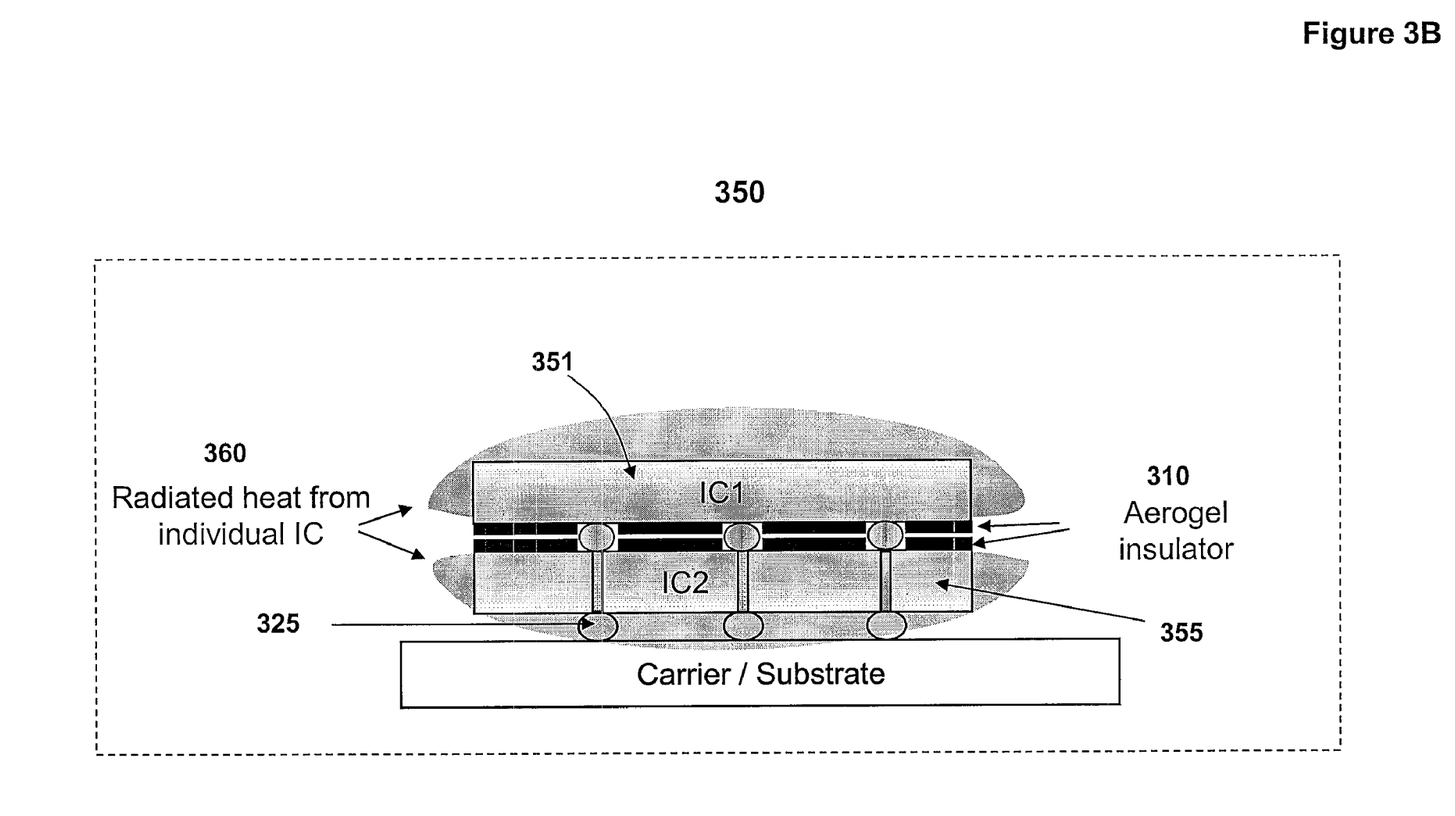
FIG. 3B illustrates thermal coupling between a pair of heat generating integrated circuits (ICs) stacked in a vertical plane, according to one embodiment.

FIG. 3B illustrates thermal coupling between a pair of heat generating integrated circuits (ICs) stacked in a vertical plane, according to one embodiment. In particular, the embodiment of FIG. 3B depicts a different view/orientation of FIG. 1A. Furthermore, FIG. 3B illustrates thermal radiation within Stack 350 of FIG. 3B. Stack 350 comprises an upper IC (e.g., upper IC 351) and a lower IC, (e.g., lower IC 355). In Stack 350, interconnects 320 is illustrated. In addition, aerogel insulator 310 is illustrated. In Stack 350, aerogel insulator 310 is applied to a lower side of the substrate of upper IC 351, prior to connecting upper IC 351 to lower IC 355. Radiated heat 360 is also illustrated.

In Stack 350, aerogel insulator 310 on the surface of the substrate of the upper integrated circuit (e.g., upper IC 351) provides a number of key advantages. These advantages include: (1) reducing the risk of overheating of critical components and circuits within the integrated circuit; (2) providing chemical and mechanical insulation from contamination after wafer processing; and (3) serving as a thermal isolator between IC chip regions of dissimilar power dissipation.

Figure 4A:
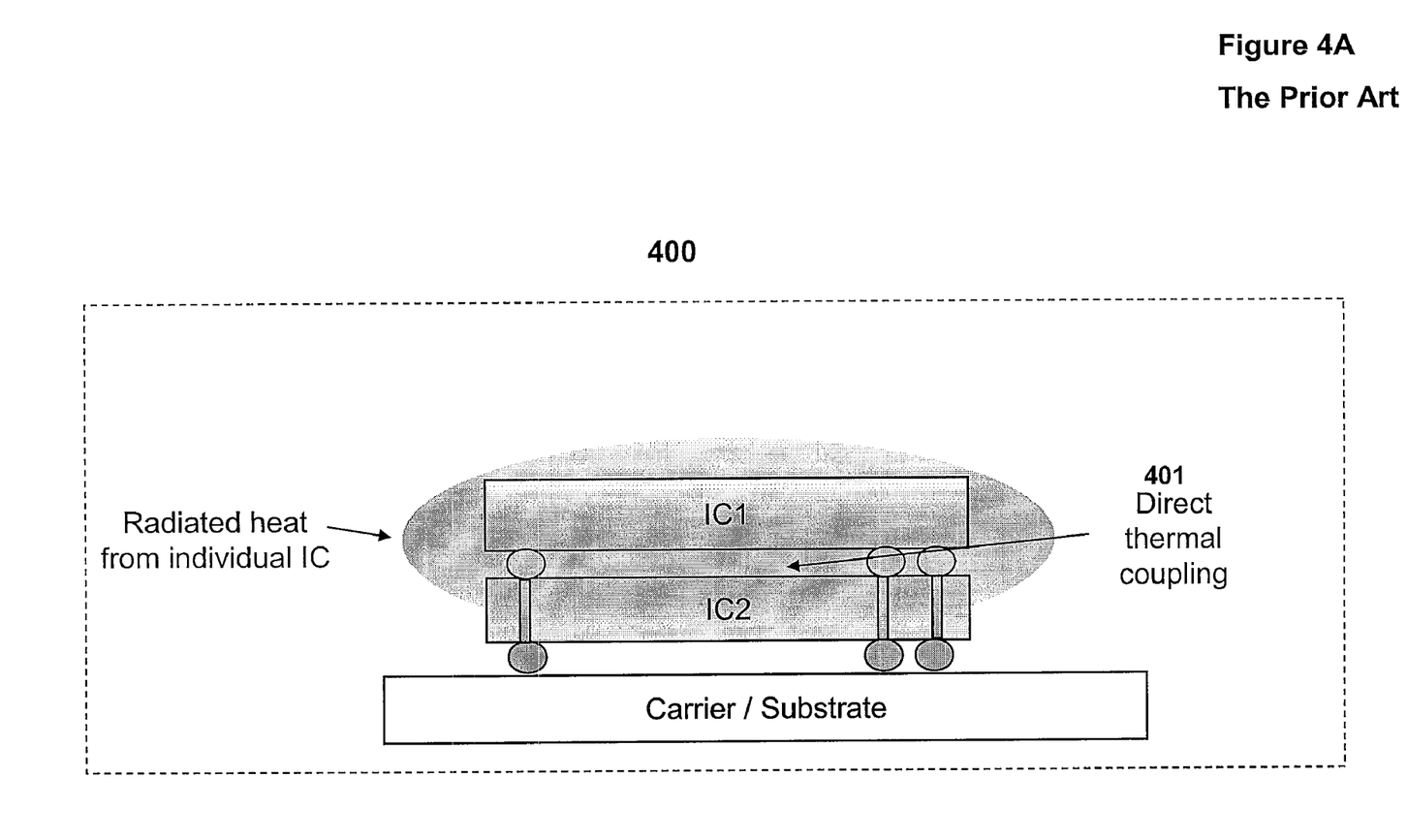
FIG. 4A illustrates thermal coupling between a pair of integrated circuits (ICs) stacked in a vertical plane, according to the prior art.

FIG. 4A illustrates thermal coupling between integrated circuits (ICs) stacked in a vertical plane, according to the prior art. Radiated heat is generated by ICs that are not attached to each other but may be within close planar proximity of each. None of the ICs within the stack have an aerogel coating. Stack 400 is illustrated with coupled heat 401. Coupled heat 401 represents the heat dissipated by a first single IC (which may be connected to a first connected IC in a first stack) coupled with the heat dissipated by a second single IC (which may be connected to a second connected IC in a second stack) in close planar proximity to the ICs of the first stack. In Stack 400, without employing an aerogel coating, an unrestricted dissipation of heat leads to an increase in thermal stress to the board and surrounding components.

Figure 4B:
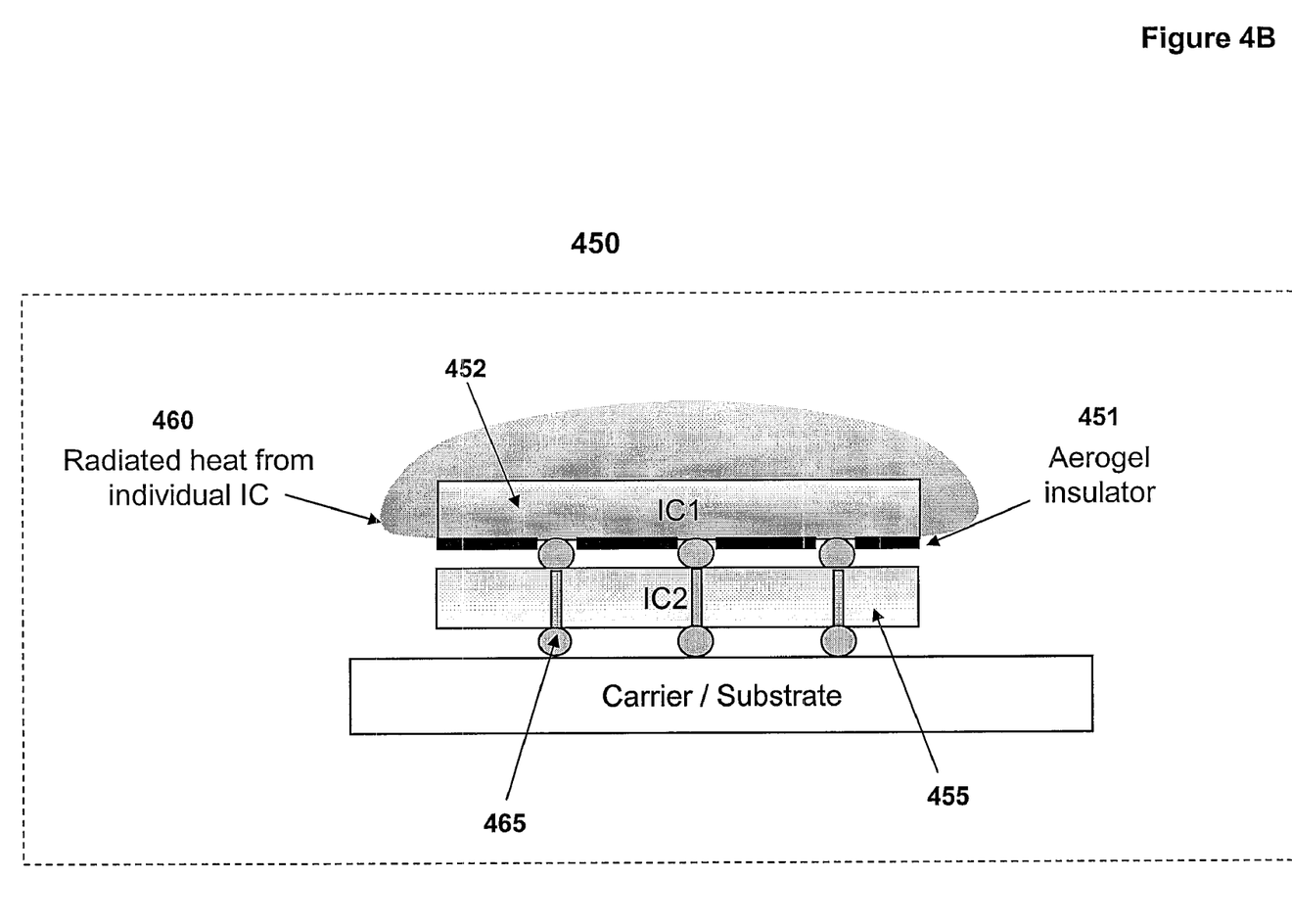
FIG. 4B illustrates thermal coupling between a pair of integrated circuits (ICs) stacked in a vertical plane, according to one embodiment.

FIG. 4B illustrates thermal coupling between a pair of integrated circuits (ICs) stacked in a vertical plane, according to one embodiment. In Stack 450, IC 455 is illustrated as well as interconnect 465. In addition, aerogel insulator 451 is illustrated. In Stack 450, aerogel insulator 451 is applied to a lower side of the substrate of upper IC 452. Radiated heat 460 is also illustrated.

In Stack 450, aerogel insulator 451 on the surface of an integrated circuit substrate provides a number of key advantages when used in a three dimensional assembly configuration. These key advantages include: (1) reducing the risk of overheating critical components and circuits within the integrated circuit, device which would otherwise manifest as degraded circuit behavior and system performance; (2) providing chemical and mechanical insulation from contamination after wafer processing during subsequent wafer handling operations (i.e., bonding, assembly, and test operations); and (3) serving as a thermal isolator between application specific integrated circuit (ASIC) regions of dissimilar power dissipation. The thermal insulator allows for efficient thermal extraction from localized hotspots (i.e., areas of high heat density) by the use of a robust cooling system attached to the top surface of the stack (e.g., Stack 450). The cooling system allows for the extraction of heat from the lower surface of the stack (e.g., Stack 450) through the less efficient thermal interface of the attaching solder connections of the printed circuit board (PCB) (into the PCBs power and ground planes). The directivity of heat extraction reduces thermal conductivity into the PCB, and enables board attachment of much higher power dissipative devices. Consequently, these devices reside in an environment which provides substantially reduced thermal stress to the board and surrounding components.

As part of the wafer processing of an integrated circuit, a sol gel (e.g., silicon dioxide) is applied to the surface of the wafer which has active IC sections and/or sections with interconnects exposed. The sol gel is able to replace conventional silicon dioxide coating of the wafer for chemical and mechanical protection. After the sol gel is applied, the wafer is exposed to a super-critical drying stage, which removes the alcohol from the sol gel. The final material coating is a super low density aerogel. Some post processing may be performed as part of the standard backend of line (BEOL) activity. Post processing may also be easily integrated into a three dimensional (3D) final assembly construction process.

Figure 5:
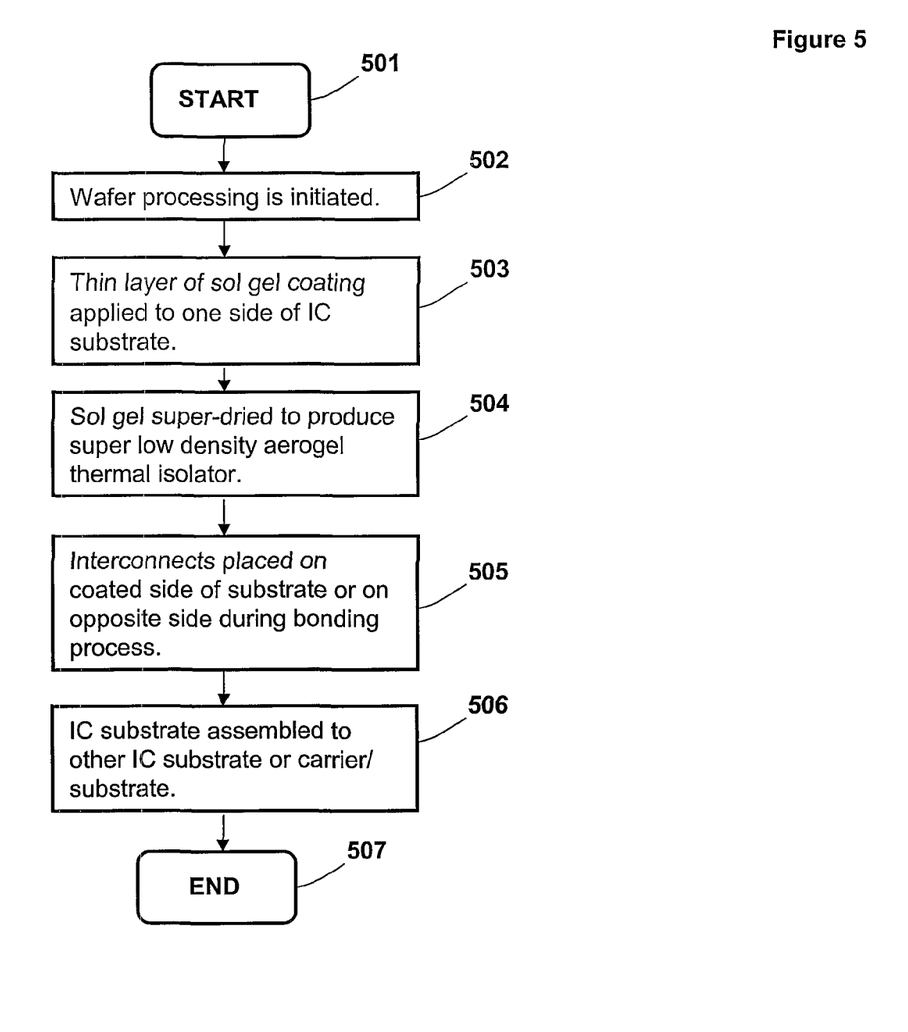
FIG. 5 is a flow chart illustrating the process of applying an insulating coating in an integrated circuit in order to improve thermal isolation, according to one embodiment.

FIG. 5 is a flow chart illustrating a method by which the above processes of the illustrative embodiments are completed. Specifically, FIG. 5 illustrates the process of applying an insulating coating in an integrated circuit in order to improve thermal isolation, according to one embodiment. Although the methods illustrated in FIG. 5 may be described with reference to components shown in FIGS. 1, 2, 3B, and 4B, it should be understood that this is merely for convenience and alternative components and/or configurations thereof can be employed when implementing the various methods.

The process of FIG. 5 begins at initiator block 501 and proceeds to block 502, at which wafer processing is initiated. At block 503, a thin sol gel coating layer is applied to one side of an IC substrate (of a first integrated circuit). At block 504, a super-critical drying stage converts the sol gel to the super low density aerogel thermal layer that provides isolation from heat dissipation and restricts thermal coupling between the integrated circuits devices. During the boding process, interconnects are placed on the coated side of the substrate or on the substrate side opposite to the sol gel coating, as shown at block 505. The first IC substrate is assembled to another IC substrate or to a carrier/substrate, as shown at block 506. The process ends at block 507.

In the flow charts above and in some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for manufacturing an electronic device having multiple components with improved thermal isolation between components, the method comprising:

applying an aerogel coating to at least a first surface of a first component; and connecting the first component to a second component, with the aerogel coating applied on the first surface and positioned between the first surface and the second component, wherein the aerogel coating provides a thermal isolation barrier reducing heat dissipation between the first component and the second component;

wherein the first component and the second component are a first Integrated Circuit (IC) and a second IC; and wherein the applying an aerogel coating comprises applying the aerogel coating to a substrate of the first IC, wherein the applying of the aerogel coating to the substrate of the first IC reduces thermal conductivity in the electronic device and enables an inclusion within the electronic device of one or more higher power dissipative devices, while reducing thermal stress to an IC board and surrounding components.

2. The method of claim 1, wherein the first component is a wafer and applying an aerogel coating further comprises:
applying a sol gel to the first surface of the wafer, said first surface being identified as a surface which has at least one of an active IC section or one or more sections with interconnects exposed drying the wafer by exposing the wafer to a super-critical drying stage, which stage removes alcohol from the sol gel to produce a material coating that is a super low density aerogel coating, wherein the aerogel coating provides chemical and mechanical protection for the wafer during wafer handling operations, including one or more of bonding operations, assembly operations and test operations, wherein the aerogel coating is applied before processing the first component and provides chemical and mechanical protection for the component during processing.

3. The method of claim 1, further comprising:
coupling interconnects to the first component and the second component to enable one or more of (a) signal exchange to and from the electronic device or (b) power transfer to and from the electronic device during device operation;
wherein when the first component and second component are integrated circuits (ICs), said coupling comprises:
interconnecting the first IC with the second IC via one or more connection mechanism from among wirebonds and raised metallic contact pads; and
connecting one or both of the first IC and the second IC to a carrier substrate utilizing one or more other connecting mechanisms from among wirebonds and raised metallic contact pads.

4. The method of claim 1, wherein said applying further comprises applying a second layer of aerogel coating on a surface of the second component that is connected, during the connecting step, to face the first surface of the first component.

5. The method of claim 1, wherein said applying further comprises:
selecting the first surface of the first component as the surface to which one or more interconnects are coupled; and
applying a different aerogel coating on a second, different surface of the first component, wherein the aerogel coating is also applied to a second, different surface to which the interconnects are not coupled.

6. The method of claim 1, further comprising:
attaching a cooling system within the electronic device to provide thermal extraction;
selectively determining a placement and location of the cooling system relative to other components within the electronic device to enable a directivity of heat extraction;
wherein a combination of the aerogel coating and said directivity of heat extraction reduces thermal conductivity in the electronic device and enables an inclusion within the electronic device of one or more higher power dissipative devices, while reducing thermal stress to the IC board and surrounding components; and
wherein the electronic device is an integrated circuit (IC) board.

\* \* \* \* \*